(12) United States Patent
Chou

(10) Patent No.: US 11,799,461 B1
(45) Date of Patent: Oct. 24, 2023

(54) MEMORY DEVICE AND SLEW RATE DETECTOR

(71) Applicant: Winbond Electronics Corp., Taichung (TW)

(72) Inventor: Yen-Yu Chou, Taichung (TW)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 18/077,172

(22) Filed: Dec. 7, 2022

(51) Int. Cl.
| | |
|---|---|
| *H03K 5/00* | (2006.01) |
| *H03K 5/12* | (2006.01) |
| *H03K 19/20* | (2006.01) |
| *H03K 5/24* | (2006.01) |
| *H03K 5/04* | (2006.01) |
| *H03K 5/1534* | (2006.01) |

(52) U.S. Cl.
CPC ............... *H03K 5/12* (2013.01); *H03K 5/04* (2013.01); *H03K 5/1534* (2013.01); *H03K 5/249* (2013.01); *H03K 19/20* (2013.01)

(58) Field of Classification Search
CPC .......... H03K 5/04; H03K 5/19; H03K 5/1565; H03K 5/1536; H03K 5/1534; H03K 5/22; H03K 19/20; H03K 5/249; H03K 5/12
See application file for complete search history.

(56) References Cited

U.S. PATENT DOCUMENTS

| | | | |
|---|---|---|---|
| 9,479,149 B1 | 10/2016 | Augustin et al. | |
| 10,044,346 B2 | 8/2018 | Holzmann | |
| 2006/0186928 A1* | 8/2006 | Liu | H03K 5/249 327/65 |
| 2009/0003086 A1* | 1/2009 | Yun | H03K 19/018585 365/189.11 |
| 2023/0102952 A1* | 3/2023 | Tsai | H03K 5/24 327/170 |

* cited by examiner

*Primary Examiner* — Tuan T Lam
(74) *Attorney, Agent, or Firm* — JCIPRNET

(57) ABSTRACT

A memory device and a slew rate detector are provided. The slew rate detector includes a clock signal generator, a pulse signal generator, a plurality of sampling comparators, and a detection result generator. The clock signal generator multiplies a frequency of a base clock signal to generate clock signals. The pulse signal generator generates first pulse signals and second pulse signals according to the clock signals. Each of the sampling comparators samples each of transmission signals to generate a reference signal according to the first pulse signals, and samples each of the transmission signals to generate a comparison signal according to the second pulse signals. The sampling comparators compare the reference signals with the comparison signals to generate comparison results. The detection result generator performs an operation on the comparison results to generate detection results.

17 Claims, 6 Drawing Sheets

| | | | | | | | | |
|---|---|---|---|---|---|---|---|---|
| Bit_ori<7:0>-1 | 0 | 0 | 0 | 0 | 0 | 0 | 0 | 0 |
| Bit_new<7:0>-1 | 0 | 0 | 0 | 0 | 0 | 1 | 1 | 1 |
| Srate0<7:0>-1 | 0 | 0 | 0 | 0 | 0 | 1 | 1 | 1 |
| Bit_ori<7:0>-2 | 0 | 0 | 0 | 0 | 0 | 0 | 0 | 0 |
| Bit_new<7:0>-2 | 0 | 0 | 0 | 0 | 0 | 0 | 0 | 1 |
| Srate0<7:0>-2 | 0 | 0 | 0 | 0 | 0 | 0 | 0 | 1 |
| Bit_ori<7:0>-3 | 1 | 1 | 1 | 1 | 1 | 1 | 1 | 1 |
| Bit_new<7:0>-3 | 1 | 1 | 0 | 0 | 0 | 0 | 0 | 0 |
| Srate0<7:0>-3 | 0 | 0 | 1 | 1 | 1 | 1 | 1 | 1 |

MEMORY DEVICE AND SLEW RATE DETECTOR

BACKGROUND

Technical Field

The disclosure relates to a memory device and a slew rate detector. In particular, the disclosure relates to a memory device and a slew rate detector adjusting a transmission path according to a signal transmission rate.

Description of Related Art

Transmission wires of critical signals are included in memory products, and the signals have certain specifications in timing and transition time points. If a shielding structure receiving a fixed voltage level is not disposed between the transmission wires to separate them from each other, the coupling state between the transmission wires may be more serious, reducing the speed of signal transmission, and even causing functional failure of a chip.

Conventionally, a shielding structure may be disposed between adjacent transmission wires to address the above issues. However, this increases a layout area of a circuit and increases cost of the circuit.

SUMMARY

The disclosure provides a slew rate detector, which effectively detects a transmission signal with a relatively great transmission delay among transmission signals.

The disclosure also provides a memory device, which increases a transmission rate of a transmission signal with a relatively great delay.

A slew rate detector according to an embodiment of the disclosure includes a clock signal generator, a pulse signal generator, a plurality of sampling comparators, and a detection result generator. The clock signal generator multiplies a frequency of a base clock signal to generate a plurality of clock signals. The pulse signal generator is coupled to the clock signal generator and generates a plurality of pulse signals according to the clock signals. The pulse signals are divided into a plurality of first pulse signals and a plurality of second pulse signals. The plurality of sampling comparators receive a plurality of transmission signals. Each of the sampling comparators sample each of the transmission signals to generate a reference signal according to the first pulse signals, and sample each of the transmission signals to generate a comparison signal according to the second pulse signals. The sampling comparators compare the reference signals with the comparison signals to generate a plurality of comparison results. The detection result generator is coupled to the sampling comparators, and performs an operation on the comparison results to generate a plurality of detection results.

A memory device according to an embodiment of the disclosure includes a first data transmission path, a second data transmission path, and a slew rate detector as described above. A data transmission rate of the second data transmission path is higher than a data transmission rate of the first data transmission path. The slew rate detector receives a plurality of transmission signals, detects slew rates of the transmission signals, and selectively transmits the transmission signals through the first data transmission path or the second data transmission path.

Based on the foregoing, the slew rate detector of the disclosure may be configured to detect a transmission signal with a relatively low transmission rate. In addition, by selecting a data transmission path with a relatively high transmission rate in the memory device, transmission of a transmission signal with a relatively low transmission rate is improved, which increases the overall transmission rate of the transmission signals and increases the performance of the memory device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
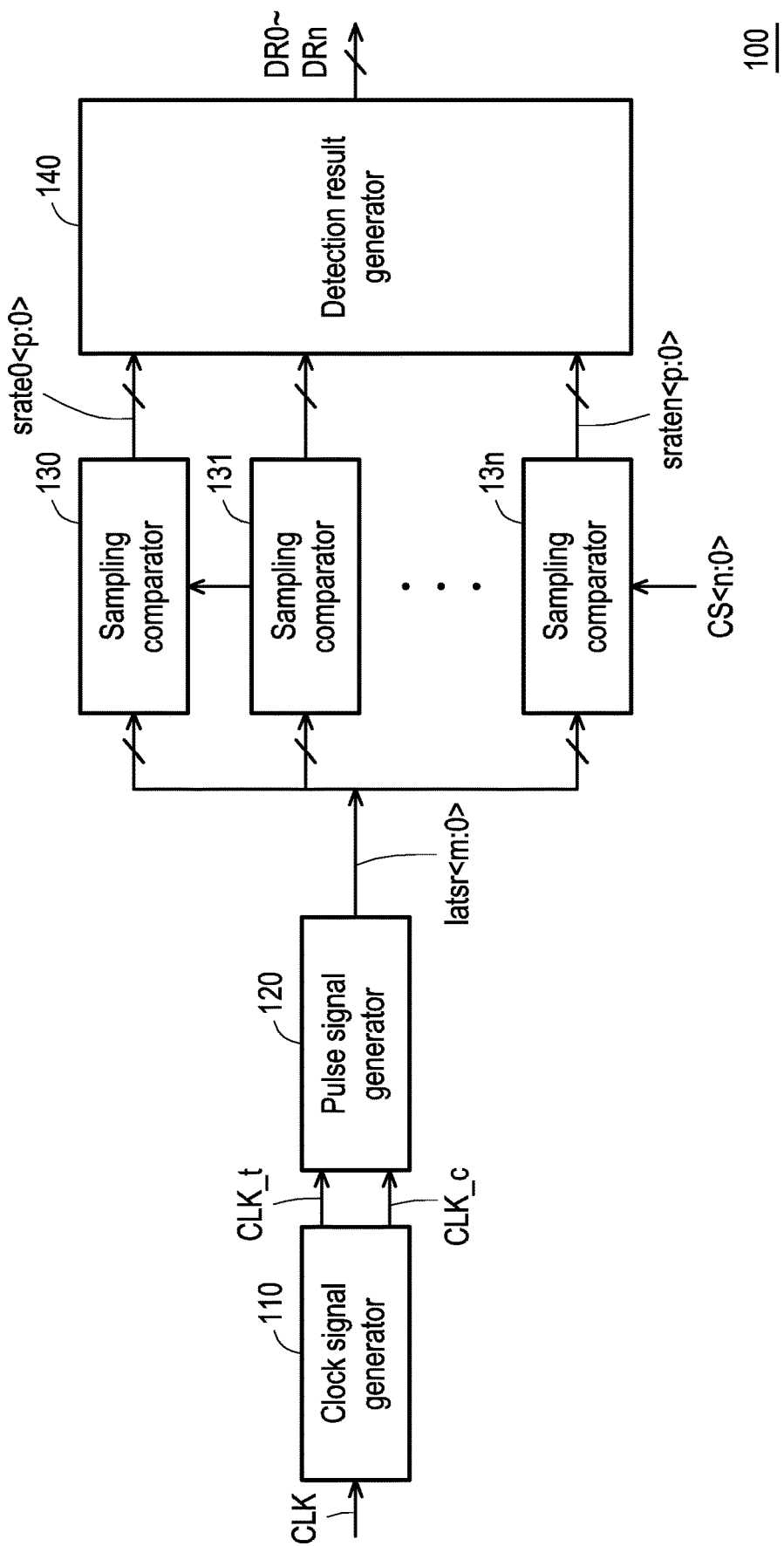
FIGS. 1 and 2 are schematic diagrams showing slew rate detectors according to different embodiments of the disclosure.

With reference to FIG. 1, FIG. 1 is a schematic diagram showing a slew rate detector according to an embodiment of the disclosure. A slew rate detector 100 includes a clock signal generator 110, a pulse signal generator 120, sampling comparators 130 to 13$n$, and a detection result generator 140. The clock signal generator 110 receives a base clock signal CLK and multiplies a frequency of the base clock signal CLK to generate a plurality of clock signals CLK_t and CLK_c. In this embodiment, the clock signals CLK_t and CLK_c are two periodic signals with complementary phases. The pulse signal generator 120 is coupled to the clock signal generator 110. The pulse signal generator 120 receives the clock signals CLK_t and CLK_c and generates a plurality of pulse signals latsr<m:0> according to the clock signals CLK_t and CLK_c. The pulse signals latsr<m:0> may be generated periodically. In addition, each of the pulse signals latsr<m:0> has only one pulse wave in the same cycle.

The sampling comparators 130 to 13$n$ are coupled to the pulse signal generator 120 and receive the pulse signals latsr<m:0>. In addition, the sampling comparators 130 to 13$n$ receive transmission signals CS<n 0>. Here, the pulse signals latsr<m:0> may be divided into two parts, i.e., a plurality of first pulse signals and a plurality of second pulse signals. If m=15 is taken as an example, the pulse signals latsr<7:0> may be the first pulse signals, and the pulse signals latsr<15:8> may be the second pulse signals. The phase of the first pulse signals leads that of the second pulse signals. The sampling comparators 130 to 13$n$ sample the corresponding received transmission signals CS<n:0> to generate a reference signal according to the first pulse signals (the pulse signals latsr<7:0>), and sample the transmission signals CS<n:0> to generate a comparison signal according to the second pulse signals (the pulse signals latsr<15:8>). The sampling comparators 130 to 13$n$ compare the reference signals with the comparison signals and generate a plurality of comparison results Srate0<p:0> to Sraten<p:0>.

Taking the sampling comparator 130 as an example, based on the phase of the first pulse signals (the pulse signals latsr<7:0>) leading that of the second pulse signals (the pulse signals latsr<15:8>), the sampling comparator 130 may sample the pre-transition level of the transmission signal CS<0> and generate the reference signal according to the pulse signals latsr<7:0>. Also, the sampling comparator 130 may sample the comparison signal reflecting the transition time point of the transmission signal CS<0> according to the pulse signals latsr<15:8>. In addition, the sampling comparator 130 may obtain the comparison result Srate0<p:0> corresponding to the transition time point of the transmission signal CS<0> by comparing the reference signal with the comparison signal. When m is equal to 15, p may be equal to 7.

In addition, the detection result generator 140 is coupled to the sampling comparators 130 to 13n. The detection result generator 140 receives comparison results Srate0<p:0> to Sraten<p:0> and performs an operation on the comparison results Srate0<p:0> to Sraten<p:0> to generate a plurality of detection results DR0 to DRn. The detection result generator 140 performs a logical operation on the comparison results Srate0<p:0> to Sraten<p:0> and calculates the detection results DR0 to DRn. The comparison results Srate0<p:0> to Sraten<p:0> reflect the transition time points of the transmission signals CS<n:0>. The detection result generator 140 calculates one or more signals in which transition occurs relatively slowly among the transmission signals CS<n:0> through a logical operation.

Figure 2:
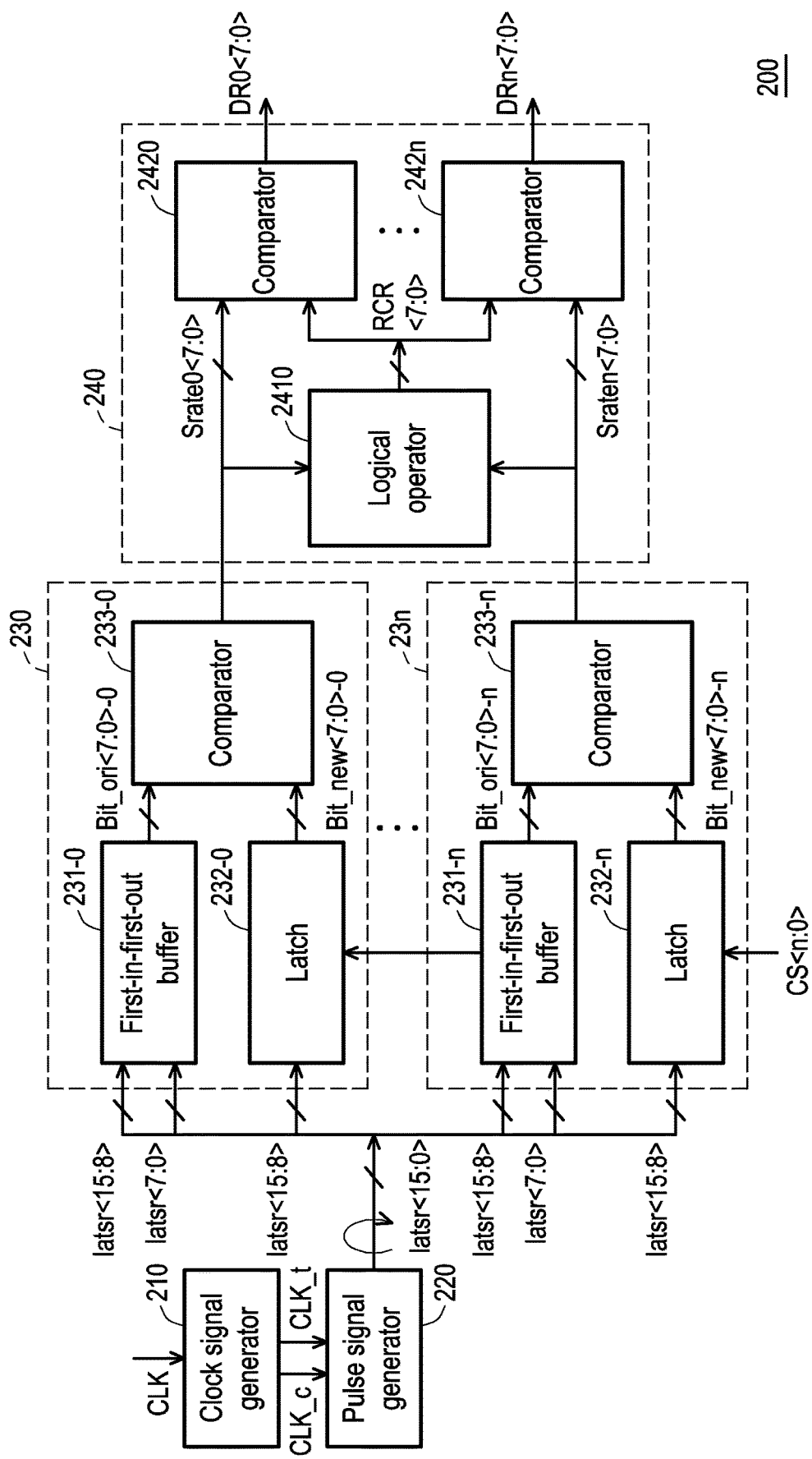

Next, with reference to FIG. 2, FIG. 2 is a schematic diagram showing a slew rate detector according to an embodiment of the disclosure. A slew rate detector 200 includes a clock signal generator 210, a pulse signal generator 220, sampling comparators 230 to 23n, and a detection result generator 240. In this embodiment, the clock signal generator 210 receives the base clock signal CLK and multiplies the frequency of the base clock signal CLK to generate the plurality of clock signals CLK_t and CLK_c. The clock signals CLK_t and CLK_c are two periodic signals with complementary phases. The pulse signal generator 220 is coupled to the clock signal generator 210 and generates a plurality of pulse signals latsr<15:0> according to the clock signals CLK_t and CLK_c. Here, the pulse signal generator 220 may periodically generate the pulse signals latsr<15:0> in repetition.

The sampling comparators 230 to 23n respectively include first-in-first-out buffers 231-0 to 231-n, latches 232-0 to 232-n, and comparators 233-0 to 233-n. The sampling comparators 230 to 23n receive the transmission signals CS<n:0>. Taking the sampling comparator 230 as an example, the first-in-first-out buffer 231-0 records a reference signal Bit_ori<7:0>-0 generated by sampling the transmission signal CS<0> according to the pulse signals latsr<7:0>. The latch 232 records a comparison signal Bit_new<7:0>-0 generated by sampling the transmission signal CS<0> according to the pulse signals latsr<15:8>.

The comparators 233-0 to 233-n compare reference signals Bit_ori<7:0>-0 to Bit_ori<7:0>-n with comparison signals Bit_new<7:0>-0 to Bit_new<7:0>-n to generate the comparison results Srate0<7:0> to Sraten<7:0>.

In addition, the detection result generator 240 includes a logical operator 2410 and a plurality of comparators 2420 to 242n. The logical operator 2410 receives the comparison results Srate0<7:0> to Sraten<7:0> generated by the sampling comparators 230 to 23n and performs a logical operation on the comparison results Srate0<7:0> to Sraten<7:0>. In this embodiment, the logical operator 2410 may be an AND gate and is configured to perform a logical AND operation on the comparison results Srate0<7:0> to Sraten<7:0> to generate a reference comparison result RCR<7:0>. In this embodiment, taking the comparison result Srate0<7:0> as an example, the transition from logic 0 to logic 1 of a plurality of bits of the comparison result Srate0<7:0> represents the transition point of the transmission signal CS<0>. Therefore, by a logical AND operation performed on the comparison results Srate0<7:0> to Sraten<7:0>, the comparison result with the least bits equal to logic 1 (with the most bits equal to logic 0) among the comparison results Srate0<7:0> to Sraten<7:0> can be made equal to the reference comparison result RCR<7:0>.

The comparators 2420 to 242n are configured to compare the reference comparison result RCR<7:0> with the comparison results Srate0<7:0> to Sraten<7:0> to accordingly know which of the comparison results Srate0<7:0> to Sraten<7:0> is equal to the reference comparison result RCR<7:0>, and generate detection results DR0<7:0> to DRn<7:0> indicating the transmission signal corresponding to the lowest transmission rate among the transmission signals CS<n:0>.

In this embodiment, each of the comparators 2420 to 242n may be a logical operator, and may be constructed by utilizing a plurality of exclusive-OR gates or a plurality of anti-exclusive-OR gates, and is configured to perform an exclusive-OR operation on a plurality of bits of the reference comparison result RCR<7:0> and the plurality of bits of each of the comparison results Srate0<7:0> to Sraten<7:0> to generate the corresponding detection results DR0<7:0> to DRn<7:0>. Alternatively, each of the comparators 2420 to 242n may perform an AND operation on the plurality of bits of the reference comparison result RCR<7:0> and the plurality of bits of each of the comparison results Srate0<7:0> to Sraten<7:0> to generate a plurality of AND operation results, and perform an OR operation on the AND operation results to generate the corresponding detection results DR0<7:0> to DRn<7:0>. In other words, each of the comparators 2420 to 242n may also be constructed by utilizing a plurality of AND-OR-inverters (AOIs).

The comparators 233-0 to 233-n may be implemented using the same circuit structure of the comparators 2420 to 242n, which will not be repeatedly described here.

Figure 3A:
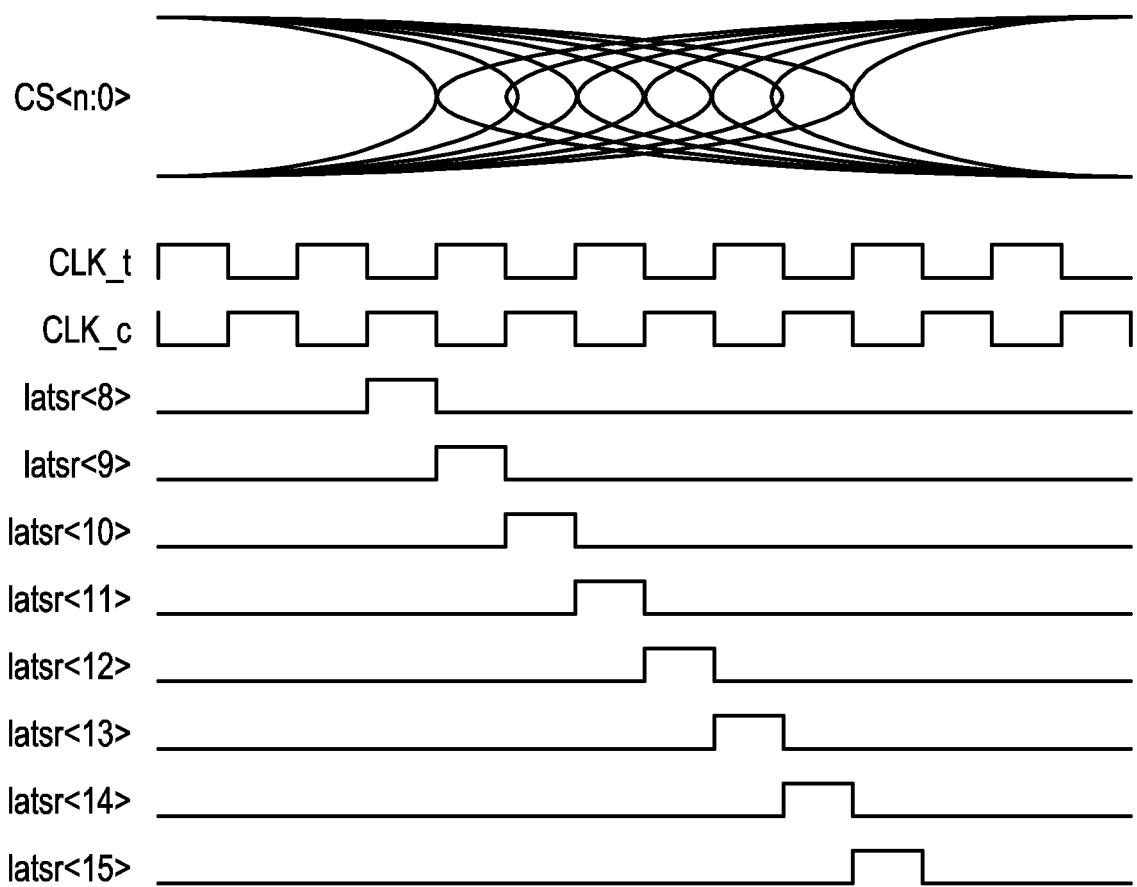
FIG. 3A and FIG. 3B are schematic diagrams showing an implementation of a slew rate detector according to an embodiment of the disclosure.
Figure 3B:
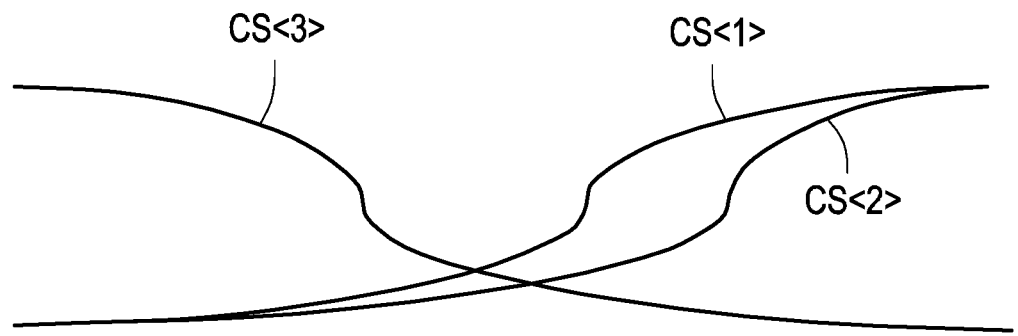

In order to describe the implementation of the slew rate detector of the disclosure more clearly, an implementation example with actual data is provided below. With reference to FIG. 3A and FIG. 3B, FIG. 3A and FIG. 3B are schematic diagrams showing an implementation of a slew rate detector according to an embodiment of the disclosure. Reference may be made to FIG. 2 for the hardware architecture. In FIG. 3A, the pulse signal generator 220 may generate a plurality of pulse signals latsr<8> to latsr<15> according to the clock signals CLK_t and CLK_c. The pulse signals latsr<8> to latsr<15> each have a plurality of pulse waves generated sequentially, and sequentially correspond to a plurality of pulse waves sequentially and alternately generated in the clock signals CLK_t and CLK_c. The plurality of pulse waves in the pulse signals latsr<8>to latsr<15> are distributed within the time interval in which the transition occurs in the transmission signals CS<n:0>.

In FIG. 3B, taking the transmission signals CS<1>, CS<2>, and CS<3> as an example, the reference signal Bit_ori<7:0>-1 and the comparison signal Bit_new<7:0>-1 corresponding to the transmission signal CS<1>, the reference signal Bit_ori<7:0>-2 and the comparison signal Bit_new<7:0>-2 corresponding to the transmission signal CS<2>, and the reference signal Bit_ori<7:0>-3 and the comparison signal Bit_new<7:0>-3 corresponding to the transmission signal CS<3> may be obtained by sampling the pulse signals latsr<0> to latsr<15>. Next, the comparison result Srate0<7:0>-1 may be generated by comparing the reference signal Bit_ori<7:0>-1 with the comparison signal Bit_new<7:0>-1 bit by bit; the comparison result Srate0<7:0>-2 may be generated by comparing the reference signal Bit_ori<7:0>-2 with the comparison signal Bit_new<7:0>-2 bit by bit; and the comparison result Srate0<7:0>-3 may be generated by comparing the reference signal Bit_ori<7:0>-3 with the comparison signal Bit_new<7:0>-3 bit by bit.

In this embodiment, taking the transmission signal CS<1> as an example, since the pre-transition level of the transmission signal CS<1> is logic 0, the reference signal Bit_ori<7:0>-1 is equal to 0, 0, 0, 0, 0, 0, 0, 0. Since transition to logic 1 occurs in the transmission signal CS<1> at the place corresponding to the $5^{th}$ bit of the comparison signal Bit_new<7:0>-1, the comparison signal Bit_new<7:0>-1 may be equal to 0, 0, 0, 0, 0, 1, 1, 1. Next, the comparison result Srate0<7:0>-1 generated by comparing the reference signal Bit_ori<7:0>-1 with the comparison signal Bit_new<7:0>-1 bit by bit is equal to 0, 0, 0, 0, 0, 1, 1, 1.

According to the description above, the comparison results Srate0<7:0>-1 to Srate0<7:0>-3 respectively corresponding to the transmission signals CS<1> to CS<3> may be generated. By an AND operation performed on the comparison results Srate0<7:0>-1 to Srate0<7:0>-3, it may be known that the value of the comparison result of the transmission signal corresponding to the slowest transmission rate is equal to 0, 0, 0, 0, 0, 0, 0, 1.

Accordingly, by comparing 0, 0, 0, 0, 0, 0, 0, 1 with the comparison results Srate0<7:0>-1 to Srate0<7:0>-3 through the comparators 2421 to 2423, it may be determined that the transmission signal CS<2> has the slowest transmission rate based on the comparison result Srate0<7:0>-2 equal to 0, 0, 0, 0, 0, 0, 0, 1. The comparator 2422 may generate the detection result DR2<7:0> equal to 0, 0, 0, 0, 0, 0, 0, 0 based on the comparison result Srate0<7:0>-2 equal to 0, 0, 0, 0, 0, 0, 0, 1.

The pre-transition level of the transmission signal CS<3> is logic 1, and the transition time thereof may also be detected using this embodiment.

Figure 4:
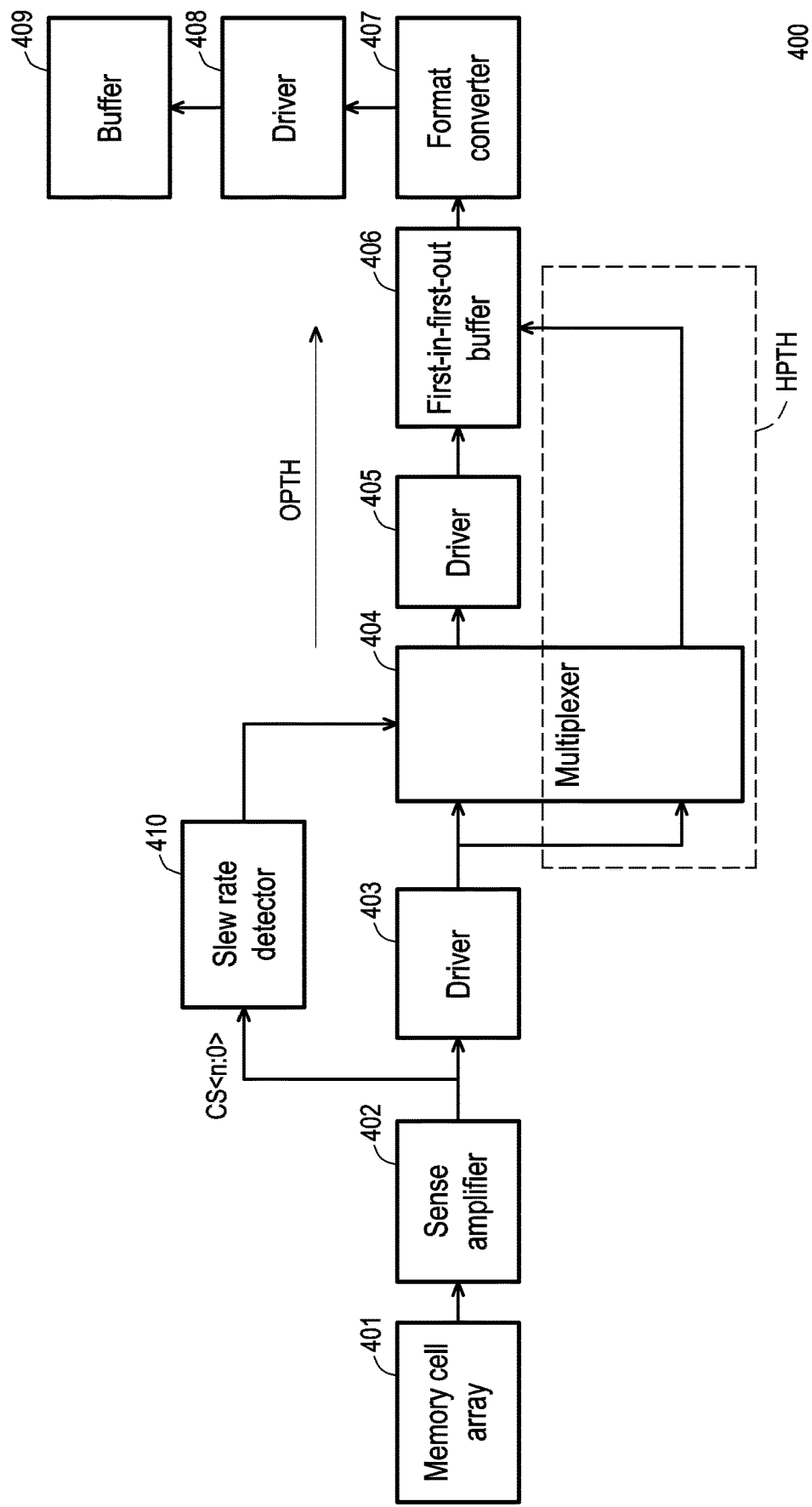
FIG. 4 is a schematic diagram showing a memory device according to an embodiment of the disclosure.

Next, with reference to FIG. 4, FIG. 4 is a schematic diagram showing a memory device according to an embodiment of the disclosure. A memory device 400 includes a memory cell array 401, a sense amplifier 402, a slew rate detector 410, drivers 403, 405 and 408, a multiplexer 404, a first-in-first-out buffer 406, a format converter 407, and a buffer 409. In this embodiment, a first data transmission path OPTH may be formed by the multiplexer 404, the driver 405, and the first-in-first-out buffer 406, and a second data transmission path HPTH may be formed between the multiplexer 404 and the first-in-first-out buffer 406. The first data transmission path OPTH does not have a shielding structure, and the second data transmission path HPTH has at least one shielding structure. The shielding structure is disposed between adjacent transmission wires to prevent interference between the transmission wires due to cross-talk, and improve the transmission rate and quality of the signal. In this embodiment, the signal transmission rate of the first data transmission path OPTH is lower than the signal transmission rate of the second data transmission path HPTH. The shielding structure may be coupled to the ground, for example.

The slew rate detector 410 is coupled between the sense signal amplifier 402 and the multiplexer 404 and is configured to detect the transmission signals CS<n:0> provided by the sense signal amplifier 402. The transmission signals CS<n:0> may be a critical signal among all signals provided by the sense signal amplifier 402. The slew rate detector 410 is configured to detect the transmission rates of the transmission signals CS<n:0> and provide the detection results to the multiplexer 404, to transmit one or more transmission signals with a relatively low transmission rate among the transmission signals CS<n:0> through the second data transmission path HPTH, and transmit transmission signal(s) with a relatively high transmission rate among the transmission signals CS<n:0> through the first data transmission path OPTH. Accordingly, the low-speed transmission signal can be compensated in terms of the transmission rate, effectively improving the overall performance of the memory device 400.

Incidentally, the memory cell array 401 of the embodiment of the disclosure may be a memory cell array known to those skilled in the art, and the form thereof is not particularly limited. In addition, the driver 408 may be an off-chip driver (OCD), and the format converter 407 may be a parallel-to-serial converter. Moreover, the sense amplifier 402, the drivers 403, 405, and 408, the multiplexer 404, the first-in-first-out buffer 406, the format converter 407, and the buffer 409 may each be implemented using relevant circuits known to those skilled in the art, and are not particularly limited.

Figure 5:
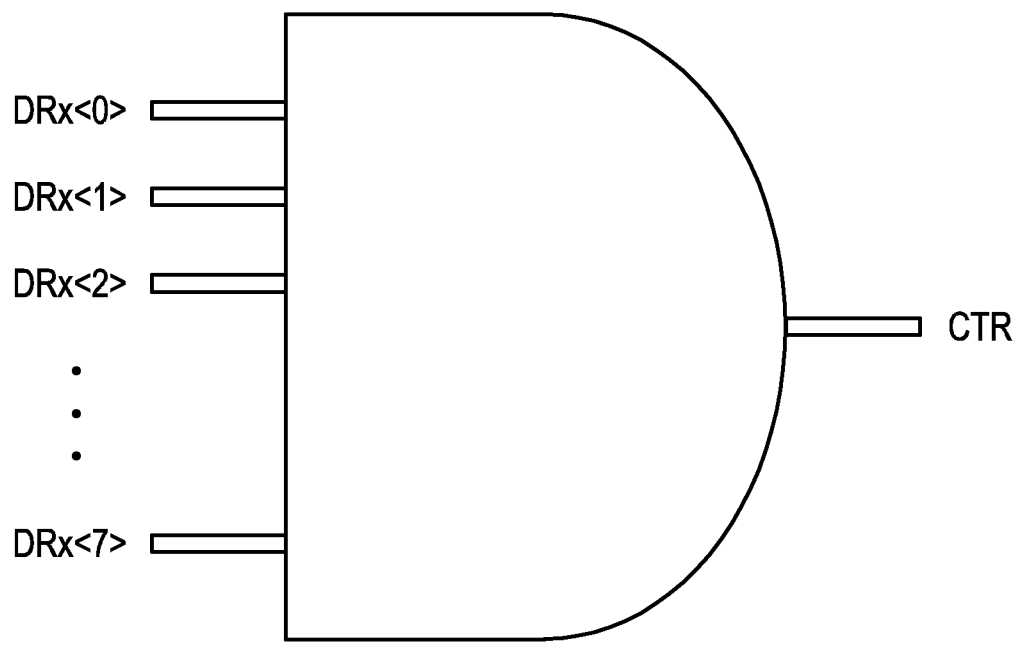
FIG. 5 is a schematic diagram showing an implementation of the slew rate detector generating a control signal of the multiplexer in the embodiment of FIG. 4 of the disclosure.

With reference to FIG. 5, FIG. 5 is a schematic diagram showing an implementation of the slew rate detector generating a control signal of the multiplexer in the embodiment of FIG. 4 of the disclosure. According to the description in the embodiment of FIG. 3B, each of the bits of the detection result of the transmission signal corresponding to the slowest transmission rate is logic 0. Therefore, the slew rate detector 410 may be provided with a logical operator 500 as shown in FIG. 5 to perform a logical operation on the detection result DRx<7:0>. Here, the detection result DRx<7:0> represents one of the detection results DR0<7:0> to DRn<7:0> in the embodiment of FIG. 2. The logical operator 500 is an AND gate, and generates a control signal CTR according to whether the detection result DRx<7:0> is all logic 0. The control signal CTR is configured to control the multiplexer to selectively transmit the corresponding transmission signal to the fast or slow transmission path.

In summary of the foregoing, in the memory device according to the embodiments of the disclosure, the transmission rates of the transmission signals are detected through the slew rate detector. In addition, different transmission paths are selected according to the detection results to transmit the transmission signals with different rates. Accordingly, in the case that the circuit layout area is not excessively increased, the transmission signal with a relatively slow transmission rate can be compensated to improve the overall signal transmission rate in the memory device and increase the performance of the memory device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A slew rate detector comprising:
   a clock signal generator multiplying a frequency of a base clock signal to generate a plurality of clock signals;
   a pulse signal generator coupled to the clock signal generator and generating a plurality of pulse signals according to the clock signals, wherein the pulse signals are divided into a plurality of first pulse signals and a plurality of second pulse signals;
   a plurality of sampling comparators receiving a plurality of transmission signals, each of the sampling comparators sampling each of the transmission signals to generate a reference signal according to the first pulse signals, and sampling each of the transmission signals to generate a comparison signal according to the second pulse signals, wherein the sampling comparators compare the reference signals with the comparison signals to generate a plurality of comparison results; and
   a detection result generator coupled to the sampling comparators, and performing an operation on the comparison results to generate a plurality of detection results.

2. The slew rate detector according to claim 1, wherein the detection result generator comprises:
   a first logical operator performing a logical operation on the comparison results to generate a reference comparison result; and
   a plurality of comparators comparing the reference comparison result with the comparison results to generate the detection results.

3. The slew rate detector according to claim 2, wherein the detection results respectively correspond to the comparison results, and when the reference comparison result is the same as the respective comparison results, the corresponding comparators enable the respective detection results.

4. The slew rate detector according to claim 2, wherein the first logical operator performs a logical AND operation on the comparison results.

5. The slew rate detector according to claim 2, wherein the transmission signal corresponding to the comparison result is a signal with a lowest transmission rate among the transmission signals.

6. The slew rate detector according to claim 2, wherein each of the comparators is a second logical operator performing a logical operation on a plurality of bits of the reference comparison result and a plurality of bits of each of the comparison results to generate the corresponding detection results.

7. The slew rate detector according to claim 6, wherein the comparators perform an AND operation on the plurality of bits of the reference comparison result and the plurality of bits of each of the comparison results to generate a plurality of AND operation results, and the second logical operator performs an OR operation on the AND operation results to generate the corresponding detection results.

8. The slew rate detector according to claim 6, wherein the comparators perform an exclusive-OR operation on the plurality of bits of the reference comparison result and the plurality of bits of each of the comparison results to generate the corresponding detection results.

9. The slew rate detector according to claim 1, wherein each of the sampling comparators comprises:
   a first-in-first-out buffer sampling the transmission signals to generate the reference signal according to the first pulse signals;
   a latch sampling the transmission signals to generate the comparison signal according to the second pulse signals; and
   a comparator comparing the reference signals with the comparison signals to generate the comparison results.

10. A memory device comprising:
    a first data transmission path;
    a second data transmission path, wherein a data transmission rate of the second data transmission path is higher than a data transmission rate of the first data transmission path; and
    the slew rate detector according to claim 1, the slew rate detector receiving a plurality of transmission signals, detecting slew rates of the transmission signals, and selectively transmitting the transmission signals through the first data transmission path or the second data transmission path.

11. The memory device according to claim 10, wherein the second data transmission path has at least one shielding structure, and the at least one shielding structure is disposed between two adjacent transmission wires in the second data transmission path.

12. The memory device according to claim 10, further comprising:
    a memory cell array;
    a sense amplifier, coupled between the memory cell array and the slew rate detector;
    a first driver, coupled to the sense amplifier;
    a multiplexer, coupled to the first driver and the slew rate detector;
    a second driver, coupled to the multiplexer; and
    a first-in-first-out buffer, coupled to the second driver and the multiplexer.

13. The memory device according to claim 12, wherein the first data transmission path is formed by the multiplexer, the second driver and the first-in-first-out buffer, the second data transmission path is formed between the multiplexer and the first-in-first-out buffer.

14. The memory device according to claim 12, wherein the slew rate detector detects the transmission signals provided by the sense signal amplifier and generates detection results to the multiplexer.

15. The memory device according to claim 14, wherein the multiplexer transmits the transmission signals through the first data transmission path or the second data transmission path according to the detection results.

16. The memory device according to claim 12, further comprising:
    a format converter, coupled to the first-in-first-out buffer;
    a third driver, coupled to the format converter; and
    a buffer, coupled to the third driver.

17. The memory device according to claim 16, wherein the format converter is a parallel-to-serial converter, and the third driver is an off-chip driver.

* * * * *